(12) United States Patent
Neunaber

(10) Patent No.: US 6,940,981 B2
(45) Date of Patent: Sep. 6, 2005

(54) APPARATUS AND METHOD OF LIMITING POWER APPLIED TO A LOUDSPEAKER

(75) Inventor: Brian Neunaber, Huntington Beach, CA (US)

(73) Assignee: QSC Audio Products, Inc., Costa Mesa, CA (US)

( * ) Notice: Subject to any disclaimer, the term of this patent is extended or adjusted under 35 U.S.C. 154(b) by 0 days.

(21) Appl. No.: 10/665,192

(22) Filed: Sep. 16, 2003

(65) Prior Publication Data

US 2004/0178852 A1 Sep. 16, 2004

Related U.S. Application Data

(60) Provisional application No. 60/454,271, filed on Mar. 12, 2003.

(51) Int. Cl.[7] .............................................. H03G 11/00
(52) U.S. Cl. ........................... 381/55; 381/96; 330/254; 330/297
(58) Field of Search ............................. 381/55, 58–59, 381/96, 189, 104, 107, 109; 330/2, 254, 278, 297, 298, 207 P

(56) References Cited

U.S. PATENT DOCUMENTS

| | | | | |
|---|---|---|---|---|
| 4,296,278 A | * | 10/1981 | Cullison et al. | 381/55 |
| 4,301,330 A | * | 11/1981 | Trump | 381/55 |
| 5,170,437 A | * | 12/1992 | Strahm | 381/106 |
| 5,249,225 A | * | 9/1993 | Williams | 379/404 |
| 5,369,711 A | * | 11/1994 | Williamson, III | 381/104 |
| 5,396,562 A | * | 3/1995 | Ishimitsu et al. | 381/107 |
| 5,577,126 A | * | 11/1996 | Klippel | 381/59 |
| 5,719,526 A | * | 2/1998 | Fink | 330/2 |
| 5,729,611 A | * | 3/1998 | Bonneville | 381/55 |
| 5,847,610 A | * | 12/1998 | Fujita | 330/298 |
| 5,854,845 A | * | 12/1998 | Itani | 381/108 |
| 6,580,318 B2 | * | 6/2003 | Taylor | 330/129 |
| 6,628,788 B2 | * | 9/2003 | Azizi | 381/57 |

OTHER PUBLICATIONS

P.J. Chapman, "Complete Thermal Protection of an Active Loudspeaker," J. Audio Eng. Soc., Preprint 5112, AES 108th Convention (Feb. 2000).

G. Penkov and P. Valtchev, "Overheat Protection Circuits for Moving Coil Loudspeakers," J. Audio Eng. Soc., Preprint 3036, AES 90th Convention (Jan. 1991).

M. T. Miles, "An Electronic Loudspeaker Enhancement and Protection Device," J. Audio Eng. Soc., Paper 6–030, AES 6th Int. Conf. (Apr. 1988).

* cited by examiner

*Primary Examiner*—Xu Mei

(57) ABSTRACT

A method of limiting the power applied to a loudspeaker is disclosed, in which both the voltage and current applied to the loudspeaker are measured, and instantaneous power is directly calculated and used to control the level of the input signal that drives the amplifier powering the loudspeaker. When the power applied to the loudspeaker exceeds a prescribed threshold, the input level to the power amplifier is reduced until the measured power falls below the threshold. Also disclosed is a method for indirectly determining the voice coil temperature from the loudspeaker's voltage and current and reducing power to the loudspeaker when the temperature exceeds a prescribed threshold. The power level is actively controlled to prevent damage to the loudspeaker and to minimize audibly objectionable artifacts.

20 Claims, 8 Drawing Sheets

APPARATUS AND METHOD OF LIMITING POWER APPLIED TO A LOUDSPEAKER

REFERENCE TO RELATED APPLICATION

This application is related to and claims priority from U.S. provisional patent application Ser. No. 60/454,271, filed on Mar. 12, 2003, which is hereby fully incorporated by reference.

BACKGROUND OF THE INVENTION

1. Field of the Invention

The present invention relates to power regulation and, in particular, to the regulation of power applied to loudspeakers.

2. Background

In many applications, it is desirable to drive a loudspeaker as loudly as possible, without causing audible distortion or damage to the loudspeaker. Loudspeakers convert electrical energy into acoustic energy and thermal energy. When alternating electrical energy (power) is applied to the leads of a loudspeaker voice coil, forces are created which interact with the magnetic field in a magnetic gap. For example, in the conventional loudspeaker 10 of FIG. 1, the voice coil 12, which is attached to the coil form 14, will move in and out of the magnetic gap 16 in response to the alternating power being applied. This interaction may result in cone motion (a.k.a. excursion). Because the voice coil is rigidly connected to the cone 18, the cone 18 and the loudspeaker spider 20 will move with the same motion as the voice coil 12, thereby producing sound. The voice coil 12, as shown in FIG. 1, is situated between a front plate 22 and a pole piece 24 in the magnetic gap 16. In the typical loudspeaker design, the magnet 26 is held into place between front plate 22 and a back plate 28. Moreover, the vent hole 30 allows heat to dissipate, while the dust dome 32 protects the voice coil area from potentially harmful debris.

Virtually all loudspeaker damage results from the application of excessive power to the loudspeaker. Loudspeakers are highly inefficient and convert most of their applied power into heat. A significant component of this heat, which is a function of wasted power over time, is generated in the voice coil 12. This heat is transferred to the surrounding parts of the loudspeaker, mostly through conduction and convection.

Types of loudspeaker damage include thermal degradation, thermal failure, mechanical failure or a combination thereof. Thermal degradation results from the repeated application of excessive power over a period of time. Repeated overheating of the voice coil 12 leads to damaging thermal-expansion effects and material fatiguing. Such thermal degradation can further lead to thermally-induced mechanical failure since the materials that comprise the voice coil 12 and related components tend to become brittle and are generally more vulnerable to mechanical shock. In addition, heating of the voice coil will cause heating of the surrounding materials; overheating of the magnet 26 can irreversibly change its magnetic properties, especially magnets made of rare-earth materials such as neodymium.

Thermal failure, like thermal degradation, results from the negative heat effects of applying excessive power to a loudspeaker. However, instead of causing gradual degradation, a strong power surge can lead to a catastrophic thermal failure in which the voice coil 12 is heated to the point where it or other components of the loudspeaker literally melt, break or burn.

On the other hand, mechanical failure may occur when excessive power moves the voice coil 12 far enough that it strikes the back plate 28 or separates from the coil form 14. Similarly, the application of excessive power can cause the voice coil 12 to put excessive stress on the cone 18 or spider 20, causing tearing. In any of these cases, the voice coil 12 may become misaligned since the cone assembly is not suspended properly. It is this voice coil misalignment or cone/spider tearing that will lead to mechanical failure.

Existing methods of power limiting include measuring the voltage applied to the loudspeaker and limiting the power based on assumptions regarding loudspeaker impedance. However, such methods do not effectively limit the power delivered to the loudspeaker.

In U.S. Pat. No. 4,233,566, Nestorovic discloses a method of limiting power to a loudspeaker based on the assumption that the loudspeaker is a fixed resistive load. However, loudspeaker impedance is not simply a resistive load, but rather varies with frequency and driver temperature. Therefore, the power delivered to the loudspeaker cannot be accurately determined by assuming the loudspeaker is a fixed resistive load.

In U.S. Pat. No. 4,327,250, von Recklinghausen describes a method of limiting that uses a model of the loudspeaker. The voltage present across the loudspeaker terminals drives the loudspeaker model, and the output of the model is compared to a threshold. However, limiting is based solely on the output of the loudspeaker model, which is merely an estimation and not a measurement of power or voice coil temperature.

In U.S. Pat. No. 4,216,517, Takahashi describes a method of circuit protection for a power amplifier in which both voltage and current are detected. This method attempts to protect the amplifier from damage when the load impedance is too small. It does not protect the loudspeaker from excessive power or distortion.

In U.S. Pat. No. 5,719,526, Fink describes a method in which both the voltage and current applied to a loudspeaker are measured, and power is calculated as a function of frequency. A record of measurement data is stored and a Fourier transformation performed, where the minimum length of this record is dictated by the lowest frequency of interest in the signal. For audio, this lowest frequency is 20 Hz, or a minimum record length of 50 milliseconds. The length of this record severely limits the response time of processing that may occur on the input signal as a result of the measured power output.

In U.S. Pat. Application No. 2002/0118841, Button describes a system that limits the temperature of a loudspeaker's voice coil by estimating the voice coil temperature and comparing it to a predetermined threshold. This system uses the input signal and a thermal model of the voice coil to estimate the voice coil temperature. However, a thermal model is inherently susceptible to inaccuracy, because it is an estimation of the voice coil temperature and not an actual measurement.

Accordingly, there is a need in the technology for apparatus and methods that overcome the aforementioned problems.

SUMMARY OF THE INVENTION

Methods and apparatus for limiting power to a load are disclosed. One aspect of the invention involves a method that comprises driving the load with an input signal from a power source, providing a power signal that is representative of a power level of the input signal and calculating a value based on said power signal according to one or more control parameters. The method further comprises limiting the input signal based on the value.

A second aspect of the invention involves mitigation or reduction of degradation of loudspeakers due to thermal effects.

Other embodiments are disclosed and claimed herein.

DETAILED DESCRIPTION OF THE EMBODIMENTS

The present invention relates to an apparatus and method of limiting the power delivered to a loudspeaker in order to prevent distortion or damage caused by signals of excessive magnitude. In one embodiment, the technique is able to quickly limit the power while minimizing the audible artifacts of the limiting process itself.

One aspect of the invention relates to limiting the true power delivered to a loudspeaker by measuring both voltage and current. The power is actively controlled in response to the measured voltage and current. In one embodiment, the invention relates to limiting the power delivered to a loudspeaker with no prior knowledge of the loudspeaker's characteristics.

A second aspect of the invention relates to an apparatus and method that quickly limits the power applied to a loudspeaker before damage or audible distortion can occur; and in doing so, the limiting process should not generate its own audibly objectionable distortion.

A third aspect of the invention provides the user with independent parameters with which to control the power limiting process. These parameters include but are not limited to (1) power level averaging time, (2) power threshold, (3) attack time, and (4) release time. In one embodiment, the invention allows the user to select between peak power limiting and average power limiting.

A further aspect of the invention involves limiting the temperature of the voice coil of the loudspeaker before damage to the loudspeaker can occur. The temperature of the voice coil, which is determined by its DC resistance, may be directly calculated from the voltage and current measured at the loudspeaker. In another embodiment, only the loudspeaker's impedance function needs to be known, and the temperature of the voice coil can be determined given any input signal of sufficient magnitude.

In one embodiment of the invention, both the voltage and current applied to the loudspeaker are measured. Using both measurements, instantaneous power can be directly calculated as the product of the two and used to control the level of the input to the amplifier in a feedback configuration. In another embodiment, the temperature of the voice coil is calculated from the measured voltage and current and used to control the level of the input to the amplifier in a feedback configuration. The level of the input may also be controlled quickly enough to prevent damage to the loudspeaker and precisely enough to minimize audibly objectionable artifacts.

Figure 1:
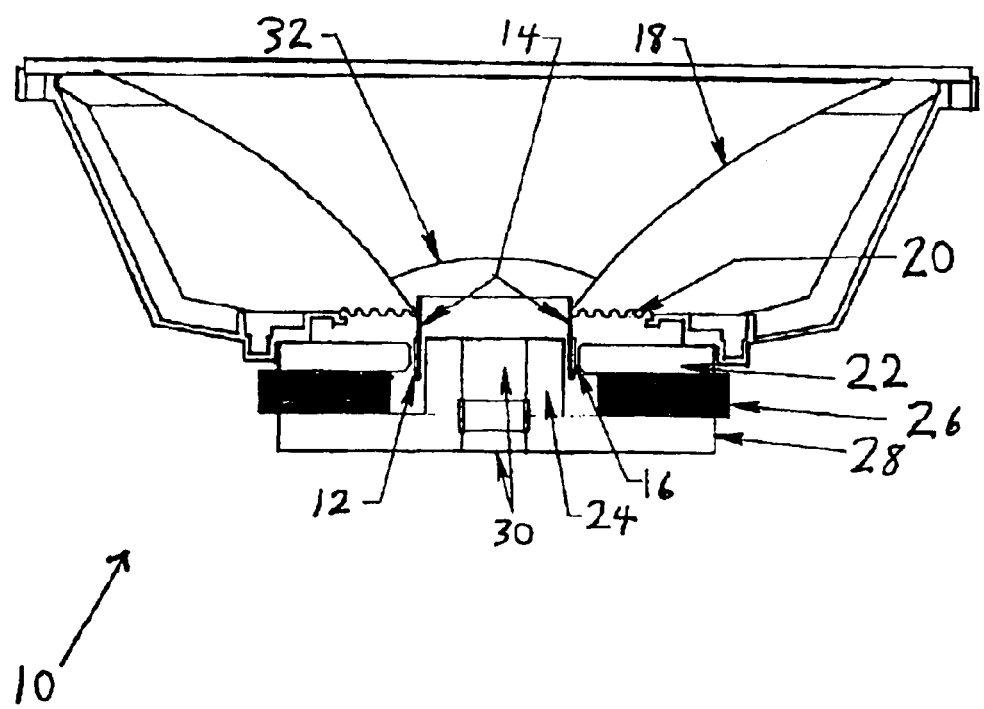
FIG. 1 is a simple schematic of a loudspeaker.
Figure 2:
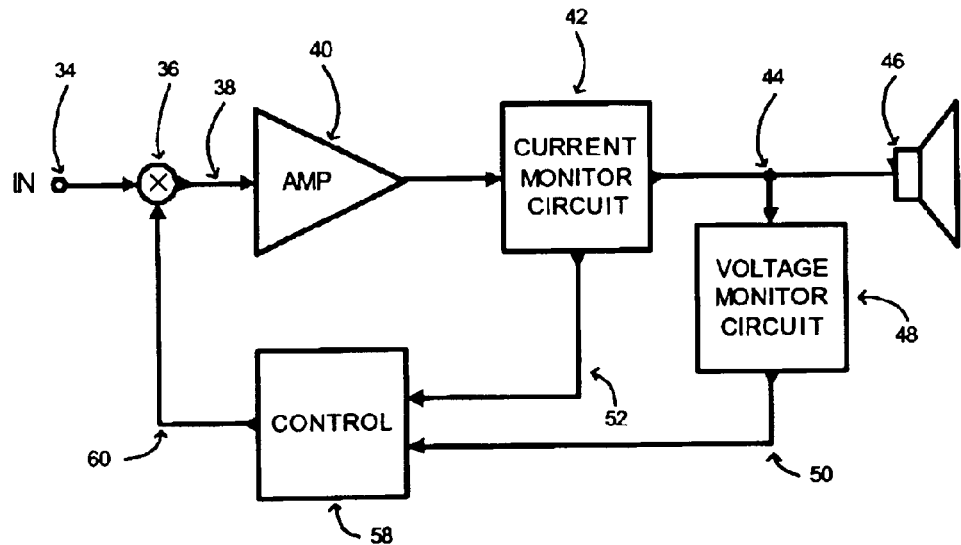
FIG. 2 is a simplified diagram of one embodiment of a power limiter, in accordance with the principles of the present invention.

FIG. 2 illustrates a simplified version of the present invention. Input signal 34 is provided to attenuator 36, the output 38 of which is provided to power amplifier 40, which drives loudspeaker 46. Voltage monitor circuit 48 generates signal 50 that is representative of the voltage present at loudspeaker input 44. Current monitor circuit 42 generates signal 52 that is representative of the current flowing through loudspeaker 46. Signals 50 and 52 drive control circuit 58. The control circuit generates gain value 60 that is used to attenuate input signal 34 when loudspeaker 46 is in danger of being damaged or producing distortion.

Figure 3:
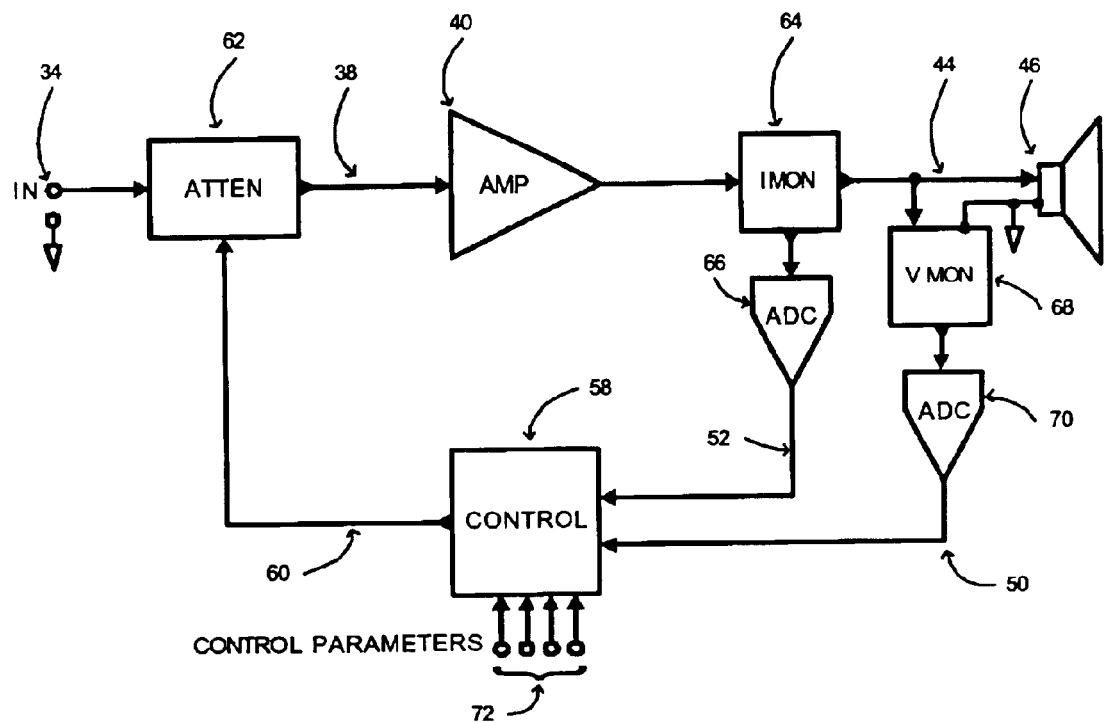
FIG. 3 is a diagram of a second embodiment of the present invention.

One embodiment of the invention is shown in FIG. 3. The level of input signal 34 is adjusted by attenuator 62, whose output 38 drives power amplifier 40. The output of power amplifier 40 passes through current monitor circuit 64 and drives loudspeaker 46.

Loudspeaker 46 in this embodiment is representative of a single loudspeaker or a plurality of loudspeakers connected by electrical means. The loudspeaker may or may not be connected to a passive crossover network. Current and voltage monitoring may occur before or after this crossover network, if available.

Current monitor circuit 64 generates a voltage that is representative of the current flowing through loudspeaker 46. This current may be measured as the current that flows from the output of power amplifier 40 to loudspeaker input 44. Analog-to-digital converter 66 samples the voltage signal generated by current monitor circuit 64. Voltage monitor circuit 68 generates a voltage that is representative of the voltage present at loudspeaker input 44. Analog-to-digital converter 70 samples the voltage signal generated by voltage monitor circuit 68.

The particular implementations of monitoring circuits 64 and 68 are not covered by this invention, and it is assumed that their effect on loudspeaker input signal 44 is negligible. FIG. 3 shows these monitoring circuits as separate from amplifier 40, but it should equally be appreciated that they may be part of amplifier 40. In such an embodiment, the outputs of these monitoring circuits accurately represent the voltage and current at the output of amplifier 40. In another embodiment, the electrical connection between the output of amplifier 40 and loudspeaker 46 may have only a negligible effect on the voltage and current at loudspeaker input 44.

Monitoring circuits 64 and 68 scale the magnitudes of the voltages they generate so that analog-to-digital converters 66 and 70 may sample them. Any DC offset that is present may be removed from outputs 52 and 50 of analog-to-digital converters 66 and 70, respectively.

In one embodiment, analog-to-digital converters 66 and 70 sample their inputs at greater than or equal to the Nyquist rate, or at a rate that is twice the highest frequency present in output signal 44. However, the scope of this invention is not limited to sampling at the Nyquist rate. If the voltage and current monitor signals are subsampled (sampled at less than the Nyquist rate), aliasing may occur. In this case, the instantaneous power is calculated as the product of the subsampled voltage and the subsampled current. Subsampling does not alter the average power measurement of the sampled signal; therefore, limiting the average power output based on a subsampled instantaneous power measurement is valid. It may be necessary to modulate the sampling frequency in order to accurately detect frequencies that would otherwise be an integer multiple of the sampling frequency. One embodiment will modulate the sampling frequency randomly or pseudo-randomly between specified lower and upper boundary frequencies.

Signals 50 and 52, which are representative of the voltage and current present at the loudspeaker, are provided as inputs to control element 58. User-input control parameters 72 may be used to determine the behavior of control element 58. In one embodiment, user-input control parameters 72 are provided as a library of user-input control parameters 72. In another embodiment, the library may contain user-input control parameters 72 that have been optimized for particular loudspeakers, and these optimized control parameters 72 may be accessed by selecting a corresponding loudspeaker from a list of available loudspeakers. In yet another embodiment, a user may manually set the user-input control parameters 72. In a further embodiment, the library of control parameters or user-selected parameters may be accessed through a graphical user interface.

Gain value 60 may be provided as an input to attenuator 62, which adjusts the level of input signal 34. In one embodiment, control element 58 may be implemented as firmware, software or hardware. In another embodiment, the control element 58 may be implemented as a linear or nonlinear gain control element. It may also be implemented as a recursive or non-recursive gain control element.

Figure 4:
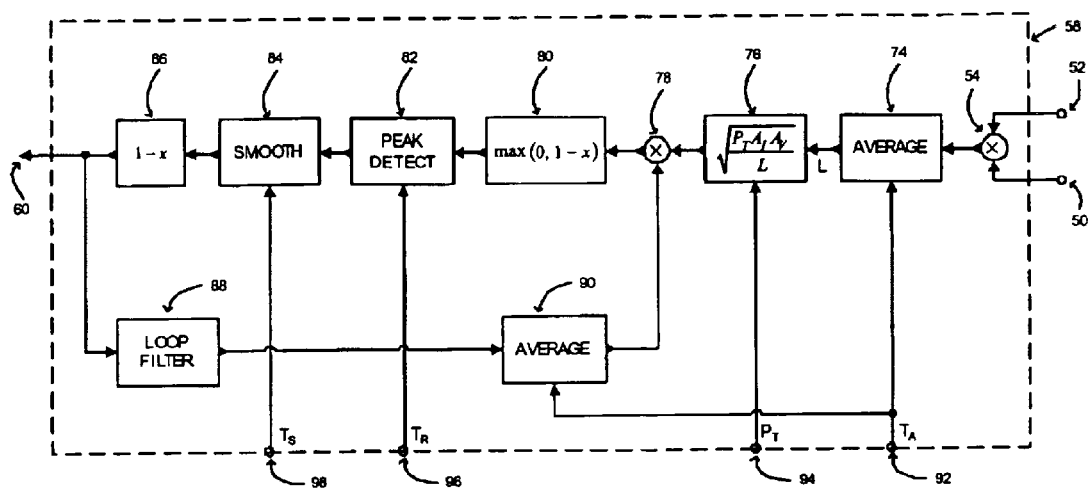
FIG. 4 is a diagram of an embodiment of the control element of FIG. 3.

One embodiment of control element 58 is shown in FIG. 4. Multiplier 54 calculates the instantaneous power measurement as the product of signals 50 and 52, which are representative of the voltage and current, respectively. The power level is calculated by averaging filter 74 from the output of multiplier 54. In one embodiment, averaging filter 74 is a second-order recursive filter. In this embodiment, two first-order low-pass filters are cascaded to produce the second-order averaging filter. Averaging coefficient 92, $T_A$, is specified by the averaging time:

$$T_A = e^{\frac{-n}{t_a f_S}} \quad (1)$$

where n is the filter order, $t_a$ is the averaging time in seconds, and $f_S$ is the sampling frequency in Hz. The scope of this invention encompasses other types of level measurements including but not limited to recursive averaging of any order and filter type, nonrecursive (transversal) averaging, and combination peak/average measurements.

If the averaging time of averaging filter 74 is set to zero, in effect bypassing the averaging filter, gain reduction may be calculated based on peak power. Setting the averaging time to greater than zero results in limiting of the average power over the time specified by averaging coefficient 92. In this implementation, therefore, either peak power or average power may be limited. In one embodiment, the averaging time is greater than or equal to 50 milliseconds for average power limiting over the audio range of frequencies.

The average power level (L), the output of averaging filter 74, is processed by gain calculation element 76. In one embodiment, the gain calculation element 76 calculates the gain such that the input signal is attenuated by an appropriate amount when the average power level (L) exceeds threshold 94, $P_T$. The output of gain calculation element 76 may be calculated as follows:

$$\text{gain} = \sqrt{\frac{P_T A_I A_V}{L}} \quad (2)$$

where $P_T$ is specified in Watts, $A_I$ and $A_V$ are correction factors for the respective gains of current monitor circuit 64 and voltage monitor circuit 68, and L is the output of averaging filter 74.

The scope of this invention encompasses other types of control, including but not limited to linear or nonlinear gain control, and piecewise linear or piecewise nonlinear gain control.

Multiplier 78 calculates the product of the output of gain calculation element 76 and the output of averaging filter 90. The output of multiplier 78 is provided to gain processing element 80. In one embodiment, gain processing element 80 inverts the gain value such that its output is a measure of gain reduction and constrains the value such that it is non-negative.

In one embodiment, peak detector 82 calculates the peak gain reduction from the output of gain processing element 80. The purpose of the peak filter is to maintain the gain reduction level over a user specified release time. A peak filter is a recursive low-pass filter that stores the maximum of its input and output as feedback to the next sample cycle. The release time, $t_R$, of the filter is determined by release coefficient 96, $T_R$:

$$T_R = e^{\frac{-n}{t_R f_S}} \quad (3)$$

In one embodiment, the peak filter is third order (n=3), although any filter order is within the scope of this invention. The third-order filter may be constructed by cascading three first-order filter sections. Each filter section compares its input and output and stores the maximum as feedback to the next sample cycle.

Typically, the output of peak detector 82 should not be allowed to change too rapidly, or its nonlinear effect on attenuated input signal 38 would be audible. Therefore, the output of peak detector 82 is smoothed by smoothing filter 84. In one embodiment, a second-order Bessel-Thomson filter may be used for smoothing filter 84, although any order or type of filter is within the scope of this invention. The Bessel-Thomson filter is used to prevent overshoot of the smoothed gain value during transition. A second-order filter was chosen because it adequately attenuates higher-order harmonics in the non-linear output of peak detector 82. If insufficiently attenuated, these higher-order harmonics would modulate the input signal at attenuator 62, resulting in audible aliasing.

In another embodiment, cascaded first-order filters may be used for smoothing filter 84. Although this results in a greater group delay than the Bessel-Thomson filter, it may be simpler to implement and will not result in overshoot of the smoothed gain value.

When averaging time 92 is equal to zero, smoothing filter 84 determines the minimum time in which the onset of gain reduction can occur. This time is specified as the attack time. The attack time is the amount of time required for gain value 60 to change by a specified amount, given that the output of gain calculation element 76 instantaneously changes from no gain reduction to the steady state destination value. The attack time may also be defined as the time constant of smoothing filter 84. The attack time determines smoothing coefficient 98, $T_S$.

In the described embodiment, the minimum release time is equal to the attack time. In other words, the release time cannot be less than the attack time. This constraint is acceptable in the vast majority of audio applications, and this embodiment is preferred over one that uses a single switched filter that determines both attack and release characteristics. A single switched filter would have a time constant that is switched between attack and release times, depending on the slope of the input to this filter. This switched filter is inherently nonlinear, and would produce aliasing in attenuator output 38. The placement of a linear smoothing filter at the end of the control signal path as described by the present invention greatly reduces audible aliasing.

Gain inversion element 86 converts the output of smoothing filter 84, which is a measure of gain reduction, into gain value 60.

Gain value 60 is also provided back into multiplier 78 through loop filter 88 and averaging filter 90. Averaging filter 90 is designed to mimic averaging filter 74, and therefore has the same averaging time 92. In one embodiment, loop filter 88 is designed to mimic the effect of the remainder of the feedback path: gain value 60, which is applied to signal input 34, which is amplified by amplifier 40, whose current and voltage are monitored by circuits 64 and 68, whose outputs are sampled by analog-to-digital converters 66 and 70. In another embodiment, loop filter 88 is a simple delay whose delay time is equal to that of the previously described feedback path.

In one embodiment, the sample rate of the control signal may be decimated at any point after averaging filter 74. Such decimation may reduce the amount of computation. In one embodiment of the above case, the control signal can be interpolated by smoothing filter 84, restoring the sample rate to its previous value.

Figure 5:
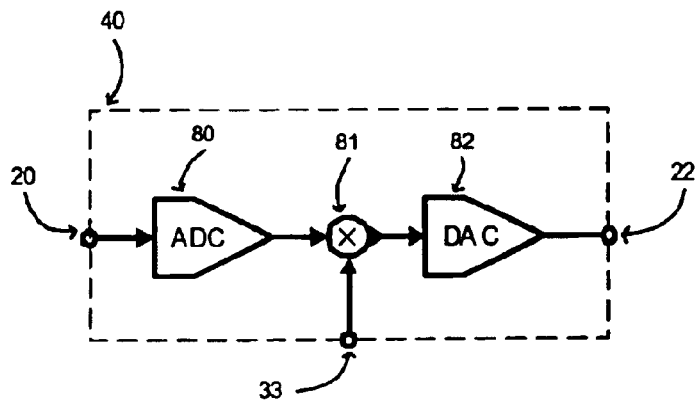
FIG. 5 is a diagram illustrating one embodiment of the attenuation element of FIG. 3, where attenuation is performed digitally and the attenuated signal is converted to analog using a digital-to-analog converter.

Gain value 60 is provided to attenuator 62, where it controls the level of the input to amplifier 40. One embodiment of attenuator 62 is shown in FIG. 5. Analog-to-digital converter 100 samples input signal 34. Multiplier 102 calculates the product of the sampled input and gain value 60. The output of multiplier 102 is converted to analog output 38 by digital-to-analog converter 104. Analog output 38 is amplified by amplifier 40 of FIG. 3.

Figure 6:
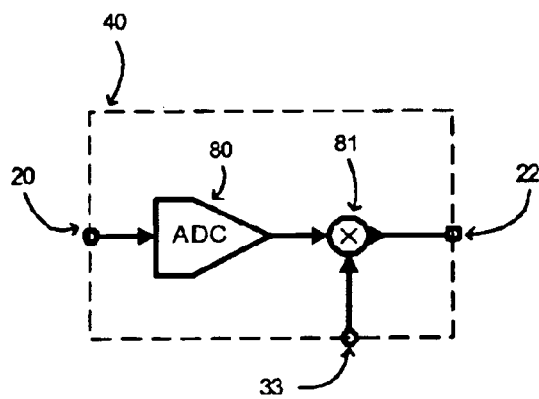
FIG. 6 is a diagram illustrating one embodiment of the attenuation element of FIG. 3, where attenuation is performed digitally and the attenuated element output is a digital signal.
Figure 7:
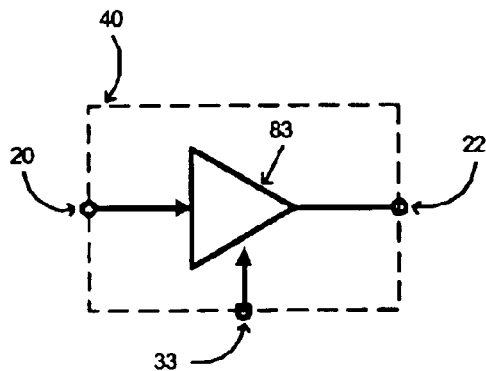
FIG. 7 is a diagram illustrating one embodiment of the attenuation element of FIG. 3, where attenuation is performed using a digitally controlled analog signal.

A second embodiment of attenuator 62 is shown in FIG. 6. Analog-to-digital converter 100 samples input signal 34. Multiplier 102 calculates the product of the sampled input and gain value 60. Digital output 38 is modulated and amplified by amplifier 40 of FIG. 3. The type of modulation in this embodiment may be pulse-width modulation, sigma-delta modulation, a variation of one of these techniques, or any other type of digital modulation technique.

In both attenuator embodiments shown in FIG. 5 and FIG. 6, input signal 34 may be delivered in digital form using a digital transmission medium. In this case, it is assumed that analog-to-digital converter 100 is present at some point in the signal chain before multiplier 102. In the case of a digitally generated signal, analog-to-digital converter 100 may be omitted without altering the scope of this invention.

Figure 8:
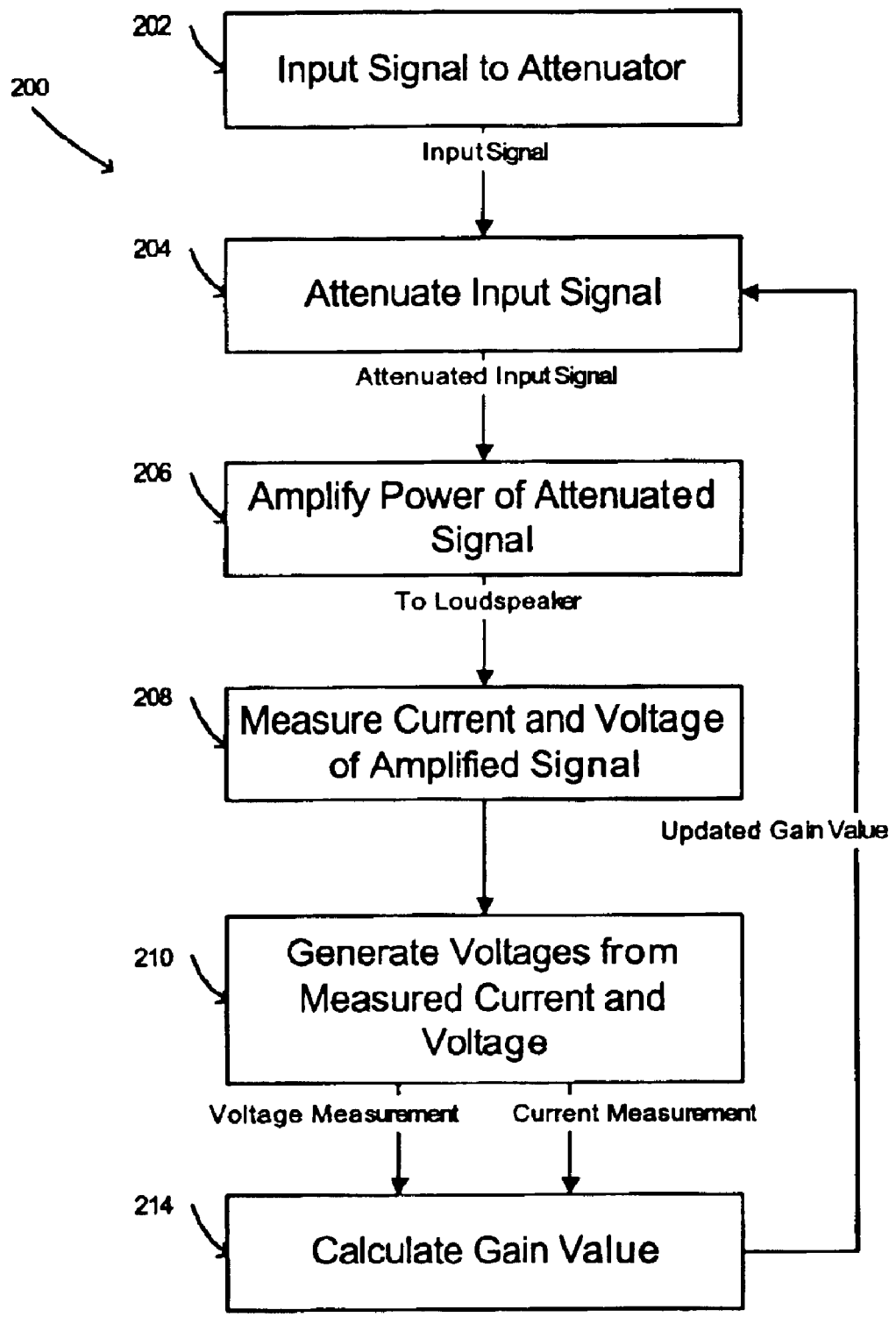
FIG. 8 is one embodiment of a process for limiting power consistent with the principles of the invention.

A third embodiment of attenuator 62 is shown in FIG. 8. Input 34 is provided to digitally-controlled analog attenuator 108, which is controlled by gain value 60. Analog output 38 is amplified by amplifier 40 of FIG. 3.

In all three of the above-mentioned embodiments, additional signal processing may occur before or after multiplier 102 or attenuator 108.

In other embodiments, the invention may be extended to a multi-channel power limiter. Each channel consists of an input 34 that is provided to attenuator 62, which feeds amplifier 40, which in turn drives loudspeaker 46. Current monitor circuit 64 generates a voltage representative of the current that flows through loudspeaker 46, which is sampled by analog-to-digital converter 66. Voltage monitor circuit 68 generates a voltage representative of the voltage at loudspeaker input 44, which is sampled by analog-to-digital converter 70. Digital current signal 52 and digital voltage signal 50 are provided to multiplier 54, which calculates the instantaneous power 56.

In one embodiment of a multi-channel power limiter, the maximum instantaneous power of all the channels is chosen as the input to control element 58. This control element is common to all channels. Other combinations of the channels, such as the maximum of all channels' average power, or the average of all channels' power measurements, are within the scope of this invention. The remainder of the control path is equivalent to that of FIG. 4. Resultant gain 60 is used on all channels to prevent the virtual audio image from shifting.

Referring now to FIG. 8, in which one embodiment for limiting power to a loudspeaker (e.g., loudspeaker 46) is depicted. Such a process may be implemented as software, firmware or hardware. In particular, process 200 begins with an input signal being provided to an attenuator at block 202. In one embodiment, the input signal is input signal 34, which is being provided to attenuator 62. The attenuator may then regulate the level of the input signal according to a current gain value (block 204). Thereafter, at block 206, the attenuator may be used to drive an amplifier (e.g., amplifier 40) with the attenuated input signal (e.g., output 38). The amplifier may then provide power to a connected loudspeaker. At block 208, a current monitor and voltage monitor may be used to measure the amplifier's current level and voltage level, respectively. In one embodiment, the current monitor is current monitor circuit 64 and the voltage monitor is voltage monitor circuit 68.

Process 200 may then continue to block 210 where the current monitor and voltage monitor generate representative signals of the current and voltage levels being provided to the loudspeaker. These signals may then be used to calculate an updated gain value, which in one embodiment is calculated according to the process discussed below with reference to FIG. 9. The updated gain value, however calculated, may then be supplied back to attenuator block 204, which in turn, may adjust the level of attenuation based on the updated gain signal.

Figure 9:
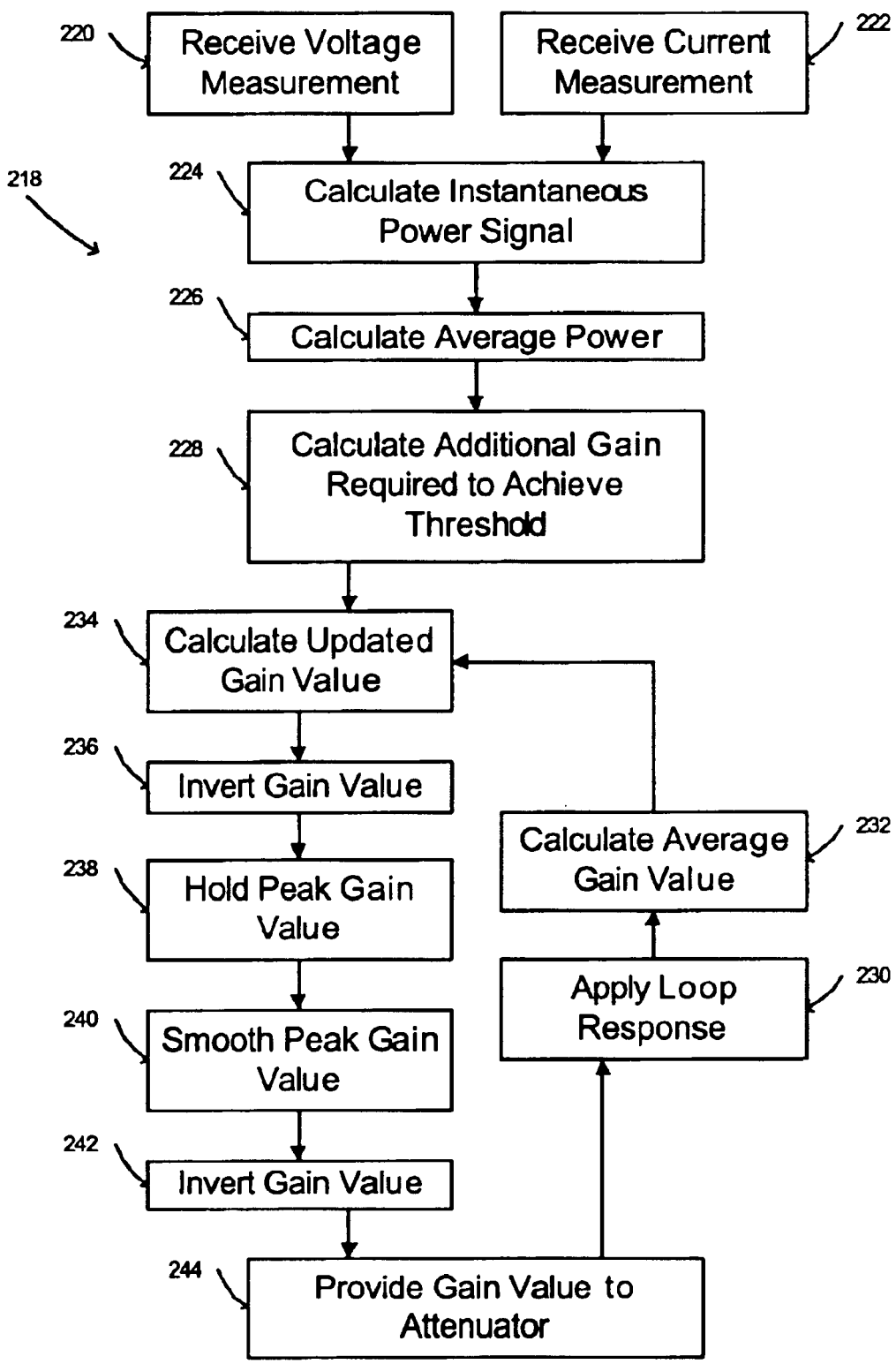
FIG. 9 is one embodiment of a process for calculating an updated gain value to be used in the process of FIG. 8.

Referring now to FIG. 9, in which one embodiment of a process 218 for calculating the updated gain value for block 214 of FIG. 8. The process 218 for calculating the updated gain value of block 214 begins at blocks 220 and 222, when the respective voltage and current measurements are received by a control block (e.g., control element 58). Process 218 then calculates the instantaneous power at block 224. From this instantaneous power, process 218 calculates a signal representative of the power level (block 226). In one embodiment, this representative signal level is calculated by averaging filter 74. While in another embodiment the representative signal level is an averaged measurement of the power signal, such as one of the averaging measurements discussed above with reference to FIG. 4, it should also be appreciated that the representative signal level may be a peak measurement. In yet another embodiment, averaging coefficient $T_A$ may be used to calculate the representative signal level of block 226.

Thereafter, at block 228, the representative signal level and predetermined power threshold are used to calculate a gain value. This calculated gain value is representative of the additional gain required at block 204 (e.g., attenuator 62) to achieve an attenuated signal level equal to the predetermined power threshold. In one embodiment, this user input power threshold is $P_T$. In one embodiment, the gain value calculation proceeds according to Equation 2.

Continuing to refer to FIG. 9, the gain value previously calculated at block 244 is supplied to block 230. This gain value is processed by a filter that mimics the response of the loop, or the signal path between the output of block 214 and the input of block 214. In one embodiment, this filter is a pure delay. Process 218 may then continue to block 232 where the average value of the filtered gain value is calculated. In one embodiment, this average is calculated in the same manner as that of block 226.

Process 218 may then continue to block 234 where the additional gain value calculated by block 228 is multiplied by the average of the previous gain value supplied by block 232. The resulting value is the gain required at block 204 (e.g., attenuator 62) to achieve an attenuated signal level equal to the predetermined power threshold. The output gain of block 234 is constrained and inverted at block 236, such that the output value is between 0 and 1 and is equal to 1 minus the input value.

Continuing to refer to FIG. 9, block 238 calculates the peak level of the gain reduction, which maintains the gain reduction level for a specified period of time. In one embodiment, the specified period of time is a function of release coefficient $T_P$.

At block 240, the gain reduction value calculated at block 238 may be smoothed using a smoothing filter, such as smoothing filter 84. Afterwards, the smoothed gain reduction value is re-inverted at block 242 to yield a gain value. This inversion process may be equivalent to that of block 234. Finally, at block 244 of process 218, the resultant smoothed gain value may then be supplied to a signal attenuator (e.g., attenuator 62) as an updated gain value.

Figure 10:
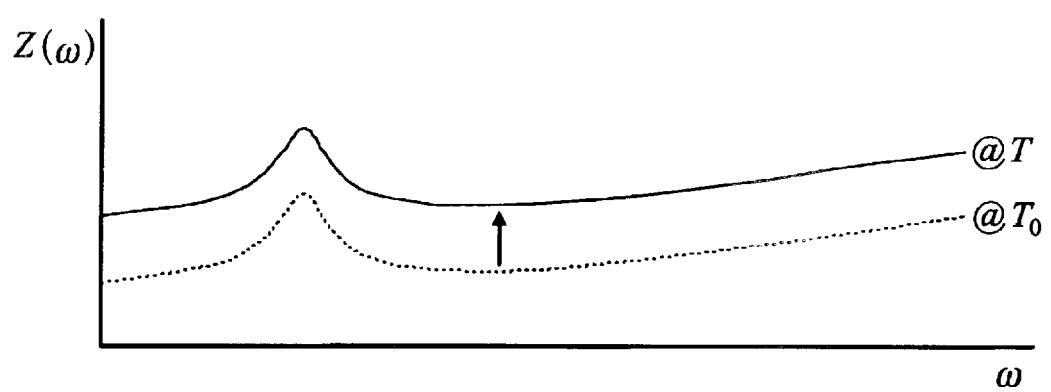
FIG. 10 is an illustration of the effect of temperature on loudspeaker impedance versus frequency.

Another aspect of the invention involves the reduction/prevention of thermal degradation of loudspeakers. Nearly all thermally induced failures of loudspeakers result from voice coil overheating. The change in DC resistance of a loudspeaker's voice coil, $$\frac{R_E}{R_0},$$

is dependent only upon its change in temperature and may be found by the following expression:

$$\frac{R_E}{R_0} = 1 + \alpha(T - T_0) + \beta(T - T_0)^2 \quad (4)$$

where $R_E$ is the DC resistance of the voice coil at operating temperature T, $R_0$ is the DC resistance of the voice coil at ambient temperature $T_0$ (typically 25 Celsius), and $\alpha$ and $\beta$ are the thermal coefficients of resistance for the material from which the voice coil is made (typically copper or aluminum). In addition, it is generally accepted that $R_E$ is the only temperature-dependent component of the equivalent electrical circuit of a loudspeaker. This means that the loudspeaker's impedance as a function of frequency, $Z(\omega)$, will shift upward with an increase in temperature, while its shape is generally unchanged. (In this context, the term loudspeaker refers to a loudspeaker mounted in an enclosure.) An illustration of this change in loudspeaker impedance with temperature is shown in FIG. 10.

Dividing the loudspeaker's impedance at temperature T by its impedance at $T_0$ results in $$\frac{R_E}{R_0},$$

from which the increase in voice coil temperature may be determined. Since the voltage driving the loudspeaker is unchanged by the loudspeaker's impedance, only the current flowing through the loudspeaker changes. Thus, only the change in current is needed to determine the change in temperature:

$$\frac{R_E}{R_0} = \frac{Z(\omega, T)}{Z(\omega, T_0)} = \frac{V}{I(\omega, T)} \cdot \frac{I(\omega, T_0)}{V} = \frac{I(\omega, T_0)}{I(\omega, T)} \quad (5)$$

One exception to this is a phenomenon known as port compression, which results when a loudspeaker in a ported enclosure is driven at high sound pressure levels. As the drive level of this loudspeaker is increased, the acoustic output at the port frequency increases proportionally less; and at high enough drive levels, the acoustic output actually decreases. This compression effect is evident in the loudspeaker's equivalent electrical impedance function and must be compensated for.

The current that flows through the loudspeaker is a function of the impedance of the loudspeaker and the voltage applied to it. In other words, this current may be modeled as the output of an admittance function, $A(\omega)$, where the voltage applied to the loudspeaker is the input to $A(\omega)$.

$$V \longrightarrow \boxed{A(\omega)} \longrightarrow I(\omega)$$

$A(\omega)$ is a function of frequency and is the reciprocal of the loudspeaker's impedance function. For present purposes, $A(\omega)$ may be determined at ambient temperature $T_0$ such that $A(\omega)$ does not change with temperature. With the measured voltage from the loudspeaker as input to $A(\omega)$, the temperature-invariant contribution to the current flowing through the loudspeaker may be estimated. Note that $A(\omega)$ may be a function of the power applied to the loudspeaker, as is the case in loudspeaker port compression.

Dividing a temperature-invariant estimation of the current by the measured current from the loudspeaker results in $$\frac{R_E}{R_0},$$

which is the only temperature-dependent portion of the loudspeaker's impedance. This estimate can be made for any signal applied to the loudspeaker; therefore, the change in voice coil resistance under normal operating conditions can be measured. The exception to this is when there is insufficient input level to make an accurate measurement; however, under these conditions, the voice coil is not susceptible to overheating. The level of the measured current and modeled current may be averaged to minimize differences due to deficiencies in $A(\omega)$.

Given the maximum temperature of the voice coil (and assuming that the actual ambient temperature is not significantly different than $T_0$), the maximum change in resistance of the voice coil can be calculated from Equation (4). By comparing this threshold value with an estimated change in voice coil resistance, $$\frac{R_E}{R_0},$$

the point at which the applied power should be reduced can be determined. Reducing the power applied to the loudspeaker will lower the temperature of the voice coil.

Since $\beta$ in Equation (4) is typically small, the change in voice coil resistance is nearly linearly related to the change in temperature. Therefore, the gain reduction calculation can be based on $$\frac{R_E}{R_0},$$

resulting in an appropriate change in voice coil temperature.

Figure 11:
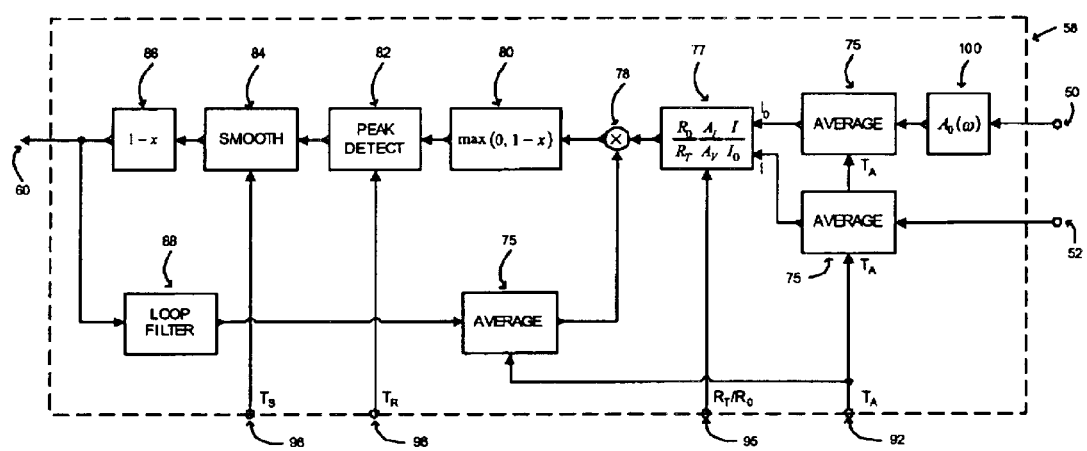
FIG. 11 is a diagram of an embodiment of the control element of FIG. 3 for performing thermal limiting.

FIG. 11 shows control element 58, which has been adapted to limit the power applied to loudspeaker 46 based on the temperature of its voice coil 12. Signals 50 and 52, which are representative of the voltage and current present at the loudspeaker, are provided as inputs to control element 58. Representative voltage signal 50 is supplied to admittance function 100, which mimics the electrical admittance of loudspeaker 46. The output of admittance function 100 is supplied to averaging function 75, which produces the average level of its input. One embodiment of averaging function 75 is an absolute value function followed by a first-order recursive averaging filter. Representative current signal 52 is supplied to a second averaging function 75. Both averaging functions 75 are identical and have averaging time specified by coefficient 92, $T_A$.

Still referring to FIG. 11, the average level of the measured current, I, and the average level of the modeled current, $I_0$, are provided to gain calculation element 77, which calculates the additional gain required for the DC resistance of the voice coil of loudspeaker 46 to be reduced to prescribed threshold value 95, $$\frac{R_T}{R_0}.$$

Prescribed threshold value 95 is calculated by Equation (6), where $T_T$ is the threshold temperature of the voice coil in Celsius.

$$\frac{R_T}{R_0} = 1 + \alpha(T_T - T_0) + \beta(T_T - T_0)^2 \qquad (6)$$

Gain calculation element 77 calculates its result in Equation (7), where $A_I$ and $A_V$ are the respective gains of the current and voltage monitoring circuits described previously.

$$\text{gain} = \frac{R_0 A_I I}{R_T A_V I_0} \qquad (7)$$

The remainder of control element 58 in FIG. 11 is identical to that of FIG. 4, with the exception of averaging function 75, which has been described previously.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus to limit power to a load, comprising:

a power source to drive the load using an input signal;

a voltage monitor coupled to the power source to detect a voltage supplied by the power source and to provide a voltage signal representative of said voltage;

a current monitor coupled to the power source to detect a current supplied by the power source and to provide a current signal representative of said current;

a control circuit to receive said voltage signal and said current signal, said control circuit to provide a value based on said voltage signal and said current signal according to control parameters which include a power averaging time and a power threshold; and, a signal attenuator coupled to the power source and the control circuit, the signal attenuator to limit said input signal based on said value, wherein an averaging coefficient ($T_A$) is calculated by the control circuit using the power averaging time according to $$T_A = e^{\frac{-n}{t_a f_s}},$$

where n is a filter order, $t_a$ is the power averaging time in seconds, and $f_s$ is a sampling frequency.

2. The apparatus of claim 1 wherein said value is a gain value, and wherein the control circuit calculates the gain value using the power threshold expressed as follows:

$$\text{gain} = \sqrt{\frac{P_T A_I A_V}{L}},$$

where L is an averaged power level, $P_T$ is the power threshold, $A_I$ is a corrective factor for the current signal, $A_V$ is a corrective factor for the voltage signal.

3. The apparatus of claim 1 wherein the control parameters further include an attack time and a release time, and wherein a release coefficient ($T_R$) is calculated by the control circuit according to, $$T_R = e^{\frac{-n}{t_R f_s}},$$

where n is a filter order, $t_R$ is the release time, and $f_s$ is a sampling frequency.

4. The apparatus of claim 1 wherein the control parameters further include a thermal threshold value, wherein the thermal threshold value is calculated according to, $$\frac{R_T}{R_0} = 1 + \alpha(T_T - T_0) + \beta(T_T - T_0)^2,$$

where and are thermal coefficients of resistance, $T_0$ is a resistance of said load at ambient temperature and $T_T$ is a threshold temperature of the load.

5. The apparatus of claim 4, wherein said value is a gain value, and wherein the control circuit calculates said gain value using the thermal threshold value expressed as follows:

$$\text{gain} = \frac{R_0 A_I I}{R_T A_V I_0},$$

where $A_I$ is a corrective factor for the current signal, $A_V$ is a corrective factor for the voltage signal, $I_0$ is representative of a modeled current and I is representative of a measured current.

6. An apparatus to limit power to a load, comprising:

a power source to drive the load;

a monitor coupled to the power source to detect a power level supplied by the power source and to provide a power signal representative of said power level;

a control circuit to receive said power signal and to provide a value based on said power signal according to one or more control parameters which include a power averaging time and a power threshold; and, a signal attenuator coupled to the power source and the control circuit, the signal attenuator to limit said power level based on said value, wherein an averaging coefficient ($T_A$) is calculated by the control circuit using the power averaging time according to $$T_A = e^{\frac{-n}{t_a f_s}},$$

where n is a filter order, $t_a$ is the power averaging time in seconds, and $f_s$ is a sampling frequency.

7. The apparatus of claim 6 wherein said value is a gain value, and wherein the control circuit calculates the gain value using the power threshold according to, $$\text{gain} = \sqrt{\frac{P_T A_I A_V}{L}},$$

where L is an averaged power level, $P_T$ is the power threshold, $A_I$ is a corrective factor for the current signal, $A_V$ is a corrective factor for the voltage signal.

8. The apparatus of claim 6 wherein the one or more control parameters further include an attack time and a release time, and wherein a release coefficient ($T_R$) is calculated by the control circuit expressed as follows:

$$T_R = e^{\frac{-n}{t_R f_s}},$$

where n is a filter order, $t_R$ is the release time and $f_s$ is a sampling frequency.

9. The apparatus of claim 6 wherein the one or more control parameters further include a thermal threshold value, wherein the thermal threshold value is calculated according to, $$\frac{R_T}{R_0} = 1 + \alpha(T_T - T_0) + \beta(T_T - T_0)^2,$$

where and are thermal coefficients of resistance, $T_0$ is a resistance of said load at ambient temperature and $T_T$ is a threshold temperature of the load.

10. The apparatus of claim 9, wherein said value is a gain value, and wherein the control circuit calculates said gain value using the thermal threshold value expressed as follows:

$$\text{gain} = \frac{R_0 A_I I}{R_T A_V I_0},$$

where $A_I$ is a corrective factor for the current signal, $A_V$ is a corrective factor for the voltage signal, $I_0$ is representative of a modeled current and I is representative of a measured current.

11. A method for limiting power to a load comprising;

driving the load with an input signal;

providing a voltage signal that is representative of a voltage of the input signal;

providing a current signal that is representative of a current of the input signal;

calculating a gain value based on said voltage signal and said current signal according to one or more control parameters which include at least one of a power averaging time, a power threshold, an attack time and a release time;

limiting the input signal based on the value; and calculating the gain value using the power threshold according to, $$\text{gain} = \sqrt{\frac{P_T A_I A_V}{L}},$$

where L is an averaged power level, $P_T$ is the power threshold, $A_I$ is a corrective factor for the current signal, $A_V$ is a corrective factor for the voltage signal.

12. The method of claim 11 further comprising calculating an averaging coefficient ($T_A$) using the power averaging time according to $$T_A = e^{\frac{-n}{t_a f_s}},$$

where n is a filter order, $t_a$ is the power averaging time in seconds, and $f_s$ is a sampling frequency.

13. The method of claim 11 further comprising calculating a release coefficient ($T_R$) according to, $$T_R = e^{\frac{-n}{t_R f_s}},$$

where n is a filter order, $t_R$ is the release time and $f_s$ is a sampling frequency.

14. The method of claim 11 wherein the one or more control parameters further include a thermal threshold value, the method further comprising calculating the thermal threshold value expressed as follows:

$$\frac{R_T}{R_0} = 1 + \alpha(T_T - T_0) + \beta(T_T - T_0)^2,$$

where and are thermal coefficients of resistance, $T_0$ is a resistance of said load at ambient temperature and $T_T$ is a threshold temperature of the load.

15. The method of claim 14, further comprises calculating said gain value using the thermal threshold value according to, $$\text{gain} = \frac{R_0 A_I I}{R_T A_V I_0},$$

where $A_I$ is a corrective factor for the current signal, $A_V$ is a corrective factor for the voltage signal, $I_0$ is representative of a modeled current and I is representative of a measured current.

16. A method for limiting power to a load comprising:

driving the load with an input signal from a power source;

providing a power signal that is representative of a power level of the input signal;

calculating a value based on said power signal according to one or more control parameters which include at least one of a power averaging time, a power threshold, an attack time and a release time;

limiting the input signal based on the value; and calculating the gain value using the power threshold according to, $$\text{gain} = \sqrt{\frac{P_T A_I A_V}{L}},$$

where L is an averaged power level, $P_T$ is the power threshold, $A_I$ is a corrective factor for the current signal, $A_V$ is a corrective factor for the voltage signal.

17. The method of claim 16 further comprising calculating an averaging coefficient ($T_A$) using the power averaging time according to $$T_A = e^{\frac{-n}{t_a f_s}},$$

where n is a filter order, $t_a$ is the power averaging time in seconds, and $f_s$ is a sampling frequency.

18. The method of claim 16 further comprising calculating a release coefficient ($T_R$) according to, $$T_R = e^{\frac{-n}{t_R f_s}},$$

where n is a filter order, $t_R$ is the release time and $f_s$ is a sampling frequency.

19. The method of claim 16 wherein he one or more control parameters further include a thermal threshold value, the method further comprising calculating the thermal threshold value expressed as follows:

$$\frac{R_T}{R_0} = 1 + \alpha(T_T - T_0) + \beta(T_T - T_0)^2,$$

where and are thermal coefficients of resistance, $T_0$ is a resistance of said load at ambient temperature and $T_T$ is a threshold temperature of the load.

20. The method of claim 19, further comprising calculating said gain value using the thermal threshold value expressed as follows:

$$\text{gain} = \frac{R_0 A_I I}{R_T A_V I_0},$$

where $A_I$ is a corrective factor for the current signal, $A_V$ is a corrective factor for the voltage signal, $I_0$ is representative of a modeled current and I is representative of a measured current.

* * * * *